(12) United States Patent
Tsumura (10) Patent No.: US 8,021,951 B2
(45) Date of Patent: Sep. 20, 2011

(54) FORMATION OF LONGITUDINAL BIPOLAR TRANSISTOR WITH BASE REGION IN TRENCHES HAVING EMITTER AND COLLECTOR REGIONS DISPOSED ALONG PORTIONS OF SIDE SURFACES OF BASE REGION

(75) Inventor: Kazuhiro Tsumura, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/807,000

(22) Filed: Aug. 25, 2010

(65) Prior Publication Data

US 2010/0323488 A1    Dec. 23, 2010

Related U.S. Application Data

(62) Division of application No. 11/805,098, filed on May 21, 2007, now Pat. No. 7,902,633.

(30) Foreign Application Priority Data

May 29, 2006    (JP) .................................. 2006-148449

(51) Int. Cl.
 *H01L 21/8222* (2006.01)
(52) U.S. Cl. ........ 438/309; 438/234; 438/235; 438/236; 438/312; 438/313; 438/315; 438/331; 438/334; 438/346; 438/347; 438/365
(58) Field of Classification Search .................. 438/234, 438/235, 236, 309, 312, 313, 315, 331, 334, 438/346, 347, 365
See application file for complete search history.

*Primary Examiner* — Thanh V Pham
(74) *Attorney, Agent, or Firm* — Adams & Wilks (57) ABSTRACT

Provided is a semiconductor device including: a silicon substrate; at least two trenches spaced apart from each other, being in parallel with each other, and being formed by vertically etching the silicon substrate from a surface thereof; an electrically insulating film for burying therein at least bottom surfaces of the trenches; a base region formed in a region of the silicon substrate located between the two trenches; and an emitter region and a collector region formed on portions of side surfaces of the trenches, respectively, the portions of the sides located above the insulating film and formed in the base region.

4 Claims, 5 Drawing Sheets

FORMATION OF LONGITUDINAL BIPOLAR TRANSISTOR WITH BASE REGION IN TRENCHES HAVING EMITTER AND COLLECTOR REGIONS DISPOSED ALONG PORTIONS OF SIDE SURFACES OF BASE REGION

CROSS REFERENCE TO RELATED APPLICATIONS

This application is a divisional of application Ser. No. 11/805,098 filed May 21, 2007, now U.S. Pat. No. 7,902,633 and claiming a priority date of May 29, 2006.

BACKGROUND OF THE INVENTION

1. Field of the Invention

The present invention relates to a semiconductor device having a bipolar transistor which can drive a large current therethrough and a method of manufacturing the same.

2. Description of the Related Art

Use of a vertical bipolar transistor is often general when a large current is required in a bipolar transistor. Meanwhile, compared to a vertical bipolar transistor, a longitudinal bipolar transistor has an advantage in its simple structure, but has a disadvantage in small drivability for current.

In order to obtain a larger current drivability in a longitudinal bipolar transistor, conventionally, there is employed a method in which a large acceleration voltage for ion implantation of impurity ions into the silicon substrate and thermal diffusion are used to form a larger emitter region and a larger collector region spreading from the surface of the silicon substrate to deep positions at the time of their formation on the silicon substrate, increasing each effective junction area of the emitter region and the collector region, which can permit a larger current to flow.

In order to drive a larger current, there is also employed a method in which V-shaped grooves is formed on a base region formed in a silicon substrate and impurity ions are implanted or diffused into the V-shaped grooves to increase each effective junction area of the emitter region and the collector region (see, for example, Japanese Patent Application Laid-open No. 52-53673).

As described above, in the vertical bipolar transistor, availability in forming large effective junction area of each the emitter region and the collector region per unit area on the surface of the silicon substrate permits a larger current compared to the longitudinal one. In the vertical structure, however, needs for formation of an epitaxial layer in order to form a collector region buried in the silicon substrate, and electrode extension in low resistance from the buried collector region to the surface of the silicon substrate require additional process steps, leading to a problem of complex manufacturing process for the bipolar transistor.

On the other hand, in the longitudinal bipolar transistor, the buried collector region and the epitaxial layer formation are not needed since the emitter region and the collector region are, unlike the vertical bipolar transistor, formed on the surface of the silicon substrate. Further, no electrode extension from the inside of the silicon substrate to the surface of the silicon substrate is also needed. Accordingly compared to the vertical bipolar transistor, a longitudinal bipolar transistor has an advantage in simplified manufacturing process.

It should be noted that, in the conventional longitudinal bipolar transistor, in order to increase the effective junction areas, for example, large acceleration voltage is applied to impurity ions to implant them into deeper positions from the surface of the silicon substrate. In this method, however, a plurality of ion implantations is needed to form the emitter region and the collector region having uniform concentration distribution of impurity ions in a depth direction.

Further, in the ion implantation, requirement for slanted ion implantation, in which impurity ions are implanted from the direction approximately seven degrees tiled from the direction perpendicular to the surface of the silicon substrate to suppress channeling, causes a problem of uniformity in the distance (base width) between the emitter region and the collector region facing each other along the base region in the depth direction.

Further, in the formation of the emitter region and the collector region through ion implantation, the impurity ions cannot be implanted deeper than a certain depth from the surface of the silicon substrate due to either selective ion implantation of impurities with photoresist shaped on the silicon substrate or slanted ion implantation of impurities mentioned above, imposing a limit to the enlargement of the effective junction areas.

Further, in the conventional longitudinal structure, for example, use of thermal diffusion to increase the effective junction areas of the emitter region and the collector region enlarges the both size of the emitter region and the collector region not only in the depth direction but also along the surface direction of the silicon substrate, increasing the areas occupied by these regions on the surface of the silicon substrate, which may result in insufficient effective drivability.

Further, formation of V-shaped grooves, for example, in the base region formed on the silicon substrate is also adopted in some conventional longitudinal structures to increase effective junction areas of the emitter region and the collector region. Even in this structure, formation of a parasitic vertical bipolar transistor causes current flow form the emitter region or the collector region to the silicon substrate via the base region, resulting in consumption as ineffective current.

SUMMARY OF THE INVENTION

The present invention has been made in view of the above, and an object of the present invention is to provide a semiconductor device having a longitudinal bipolar transistor having easily enlarged effective junction areas to drive large current, a uniform base width along the depth direction, and an improved current amplification factor (hFE) by decreasing ineffective current, and a method of manufacturing the same.

In order to attain the above-mentioned object, the present invention provides the followings.

A semiconductor device according to the present invention includes: a silicon substrate; at least two trenches spaced apart from each other, being in parallel with each other, and being formed by vertically the silicon substrate from a surface thereof; an electrically insulating film for burying therein at least bottom surfaces of the trenches; a base region formed in a region of the silicon substrate located between the two trenches; and an emitter region and a collector region formed on portions of sides of the trenches, respectively, the portions of the sides being located above the insulating film and being formed in the base region.

Further, in the semiconductor device of the present invention, at least one of the emitter region and the collector region is formed of a material disposed on the side of the trench containing a large amount of impurity.

Further, in the semiconductor device of the present invention, the material is a polycrystalline silicon film.

Further, in the semiconductor device of the present invention, the trenches are filled with the insulating film except for positions where the emitter region and the collector region are formed.

Further, the semiconductor device of the present invention further includes a connecting trench for connecting the at least two trenches so that the connecting trench surrounds together with the at least two trenches, the emitter region, the base region, and the collector region. In the semiconductor device, the insulating film fills the connecting trench.

Further, in the semiconductor device of the present invention, one of the trenches surrounds another of the trenches.

Further, a method of manufacturing a semiconductor device according to the present invention includes: a base region forming step of forming a base region on a side of a surface of a silicon substrate; a trench forming step of forming at least two trenches below the surface of the silicon substrate on portions of a border between the base region and the silicon substrate seen from the side of the surface by vertically etching the silicon substrate from the surface thereof so that the trenches face each other with the base region interposed therebetween; an insulating film forming step of forming an electrically insulating film on at least bottom surfaces of the trenches; and a region forming step of forming an emitter region and a collector region on sides of the trenches formed in the base region.

Further, a method of manufacturing a semiconductor device according to the present invention includes: a base region forming step of forming a base region on a side of a surface of a silicon substrate; a trench forming step of forming a substantially ring-shaped first trench in a plan view below the surface of the silicon substrate and on an entire border between the base region and the silicon substrate seen from the side of the surface by vertically etching the silicon substrate from the surface thereof, and forming a second trench below the surface of the silicon substrate and inside the first trench with the base region interposed between the first trench and the second trench by vertically etching the silicon substrate from the surface thereof; an insulating film forming step of forming an electrically insulating film on at least bottom surfaces of the first trench and the second trench; and a region forming step of forming one of an emitter region and a collector region on a side of the first trench formed in the base region, and forming another of the emitter region and the collector region on a side of the second trench.

Further, the method of manufacturing a semiconductor device of the present invention, the semiconductor device having a longitudinal bipolar transistor and a plurality of MOS transistors mounted thereon, the method further includes the step of forming simultaneously with the trench forming step, by etching the silicon substrate from the surface thereof.

According to the present invention, formation of trenches extending from the surface of the silicon substrate to the depth direction enables easy increase in the effective junction areas of the emitter region and the collector region facing each other along the base region, permitting to provide a semiconductor device having a longitudinal bipolar transistor with a large current drivability.

DETAILED DESCRIPTION OF THE PREFERRED EMBODIMENTS

Figure 1:
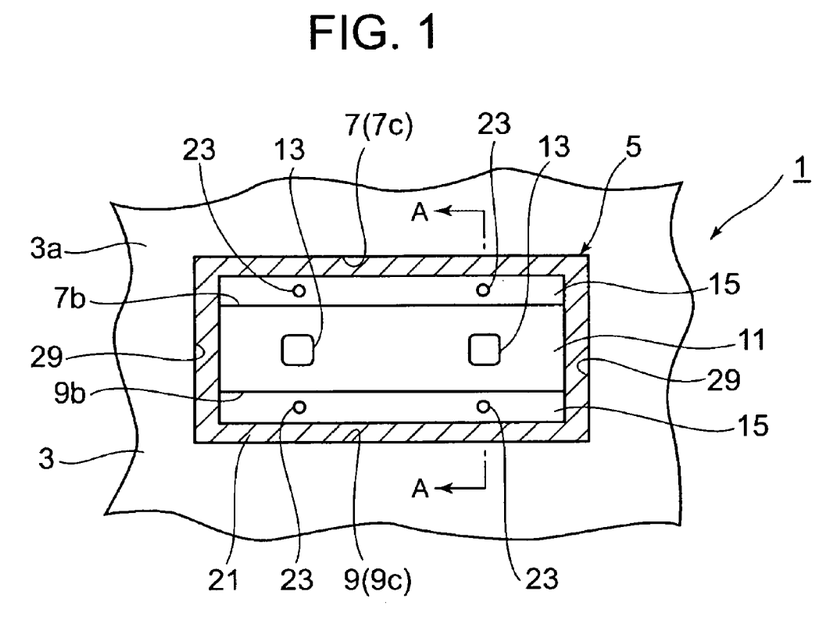
FIG. 1 is a schematic plan view of a semiconductor device according to a first embodiment of the present invention seen from a surface side of a silicon substrate.
Figure 2:
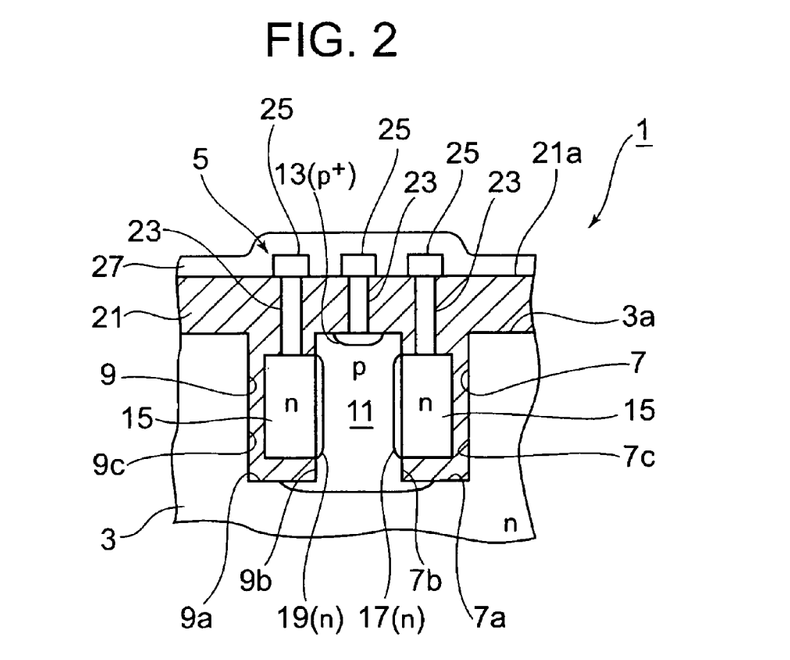
FIG. 2 is a sectional view taken along the arrows A-A of FIG. 1.

FIGS. 1 to 3 illustrate a first embodiment according to the present invention. As illustrates in FIGS. 1 and 2, a semiconductor device 1 according to the embodiment has a structure in which a longitudinal bipolar transistor 5 is provided on a silicon substrate 3. The longitudinal bipolar transistor 5 is structured as follows.

The silicon substrate 3 which is an n-type semiconductor substrate has two trenches 7 and 9 formed therein. The two trenches 7 and 9 are formed by vertically etching the silicon substrate 3 from a surface 3a thereof. The two trenches 7 and 9 are formed in the shape of narrow grooves at a width of about 1 µm so as to extend in parallel with each other in a direction of the surface 3a of the silicon substrate 3. In other words, the trenches 7 and 9 are spaced apart from each other.

A region of the silicon substrate 3 located between the two trenches 7 and 9 is a p-type region forming a base region 11. The impurity concentration of the p-type region is $1 \times 10^{16}$ cm$^3$ to $1 \times 10^{19}$/cm$^3$, for example. The base region 11 is formed to a deeper position than bottom surfaces 7a and 9a of the trenches 7 and 9. The width of the base region 11 is larger than the distance between one side 7b of the trench 7 and one side 9b of the trench 9 both located on the side of the base region 11 and smaller than the distance between the other side 7c of the trench 7 facing the side 7b and the other side 9c of the trench 9 facing the sides 9b. In other words, the base region 11 is formed so as not to cover the whole of the two trenches 7 and 9.

In the base region 11, a heavily doped p-type region 13 for pulling out a base electrode (hereinafter referred to as base electrode outlet region 13) is formed in a part of the silicon substrate 3 on the side of the surface 3a of the silicon substrate 3. The p-type impurity concentration of the base electrode outlet region 13 is higher than that of the base region 11, and the base electrode outlet region 13 is not protruded to both the side surfaces 7b and 9b consisting the trenches 7 and 9, respectively.

A polycrystalline silicon film 15 containing a large amount of an n-type impurity is provided in each of the trenches 7 and 9. The polycrystalline silicon films 15 are provided along the sides 7b and 9b of the trenches 7 and 9 respectively formed in the base region 11. Each the polycrystalline silicon films 15 are disposed along the side surfaces 7b and 9b and below the surface 3a of the silicon substrate 3, and are not in contact with the bottom surfaces 7a and 9a and the other side surfaces 7c and 9c of the trenches 7 and 9, respectively.

Impurity diffusion regions 17(n) and 19(n) are formed on each of the sides 7b and 9b of the trenches 7 and 9 respectively by diffusing an n-type impurity from the polycrystalline silicon films 15 into the base region 11 which is a p-type region. One of the impurity diffusion regions works as an emitter region 17 while the other works as a collector region 19.

An electrically insulating film 21 which is a silicon oxide film fills the trenches 7 and 9 except for positions where the polycrystalline silicon films 15 are formed. In other words, the insulating film 21 is formed so as to bury therein the bottom surfaces 7a and 9a and the other sides 7c and 9c of the trenches 7 and 9. More specifically, the polycrystalline silicon films 15 and the impurity diffusion regions forming the emitter region 17 and the collector region 19 are buried in the insulating film 21.

The insulating film 21 also covers the whole surface 3a of the silicon substrate 3. Metal interconnects 25 for electrical connection through contacts 23 with the base electrode outlet region 13 or the polycrystalline silicon films 15 forming the emitter region 17 and the collector region 19 are provided on the surface 21a of the insulating film 21. The surface 21a of the insulating film 21 and the metal interconnects 25 are covered with a protective film 27 which is a silicon nitride film or the like.

As described above, the longitudinal bipolar transistor 5 is formed by the base region 11, the emitter region 17, and the collector region 19 disposed on the silicon substrate 3.

It should be noted that the above-mentioned two trenches 7 and 9 are connected by a pair of connecting trenches 29 at both ends of the trenches 7 and 9. The connecting trenches 29 are, similarly to the above-mentioned trenches 7 and 9, formed by vertically etching the silicon substrate 3 from the surface 3a thereof, having the depth the same as that of the two trenches 7 and 9. In other words, the two trenches 7 and 9 and the pair of connecting trenches 29 form a ring-shaped trench surrounding the base region 11.

The insulating film 21 fills the pair of connecting trenches 29. In other words, the longitudinal bipolar transistor 5 is electrically insulated from the silicon substrate 3 except for a bottom surface of the base region 11.

Next, a method of manufacturing the semiconductor device 1 is now described as follows.

Figure 3A:
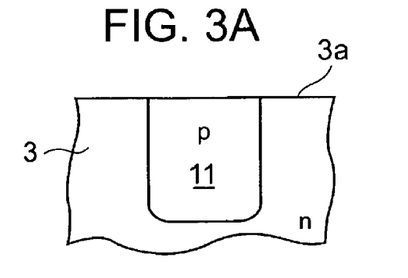
FIGS. 3A to 3G are schematic sectional views illustrating process steps of manufacturing the semiconductor device of FIG. 1.

First, as illustrated in FIG. 3A, a p-type region forming the base region 11 is formed by ion implantation on the side of the surface 3A of the n-type silicon substrate 3 (base region forming process). Here, the size of the p-type region is set to be larger than the two trenches 7 and 9 and of the connecting trenches 29 in depth, and such that removal of the border between the p-type region and the n-type silicon substrate 3 in a plan view can be carried out in the formation of the two trenches 7 and 9 and the connecting trenches 29. In other words, the p-type region is formed such that the periphery of the p-type region is located in a region where the two trenches 7 and 9 and the connecting trenches 29 are formed.

Figure 3B:
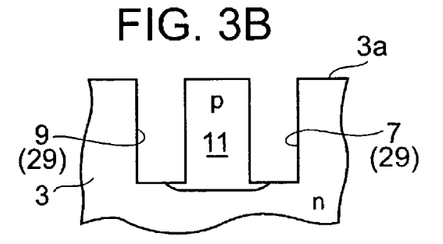

Then, as illustrated in FIG. 3B, the two trenches 7 and 9 and the connecting trenches 29 are formed by anisotropic dry etching (trench forming process). In the process, as described above, the two trenches 7 and 9 and the connecting trenches 29 are formed below the surface 3a of the silicon substrate 3 by vertically etching the silicon substrate 3 from the surface 3a thereof such that the border between the base region 11 and the silicon substrate 3 seen from the side of the surface 3a of the silicon substrate 3 is removed.

After that, the insulating film 21 is formed to bury therein the bottom surfaces 7a and 9a and the other sides 7c and 9c of the trenches 7 and 9 and the connecting trenches 29 and to cover simultaneously the surface 3a of the silicon substrate 3 (insulating film forming process).

Figure 3C:
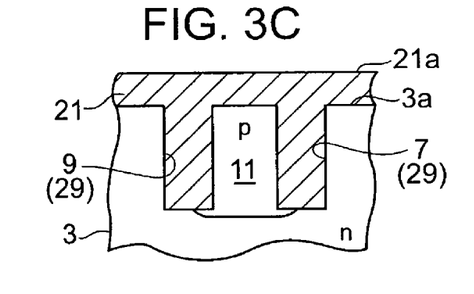
Figure 3D:
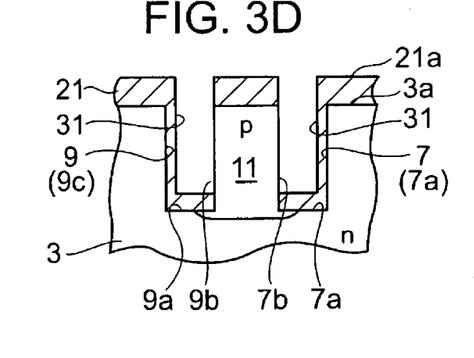

In this process, first, as illustrated in FIG. 3C, by thermal oxidation and deposition, the insulating film 21 for burying therein the trenches 7 and 9 and the connecting trenches 29 and for covering the whole surface 3a of the silicon substrate 3 is formed. Then, as illustrated in FIG. 3D, anisotropic dry etching is conducted to form trenches 31 for film formation which expose each side 7b and 9b of the trenches 7 and 9, respectively, facing each other with the base region 11 therebetween. In the anisotropic dry etching, photoresist film (not shown) is disposed on parts of the surface 21a which are to be remained. At the completion of the process, the bottom surfaces 7a and 9a and the other sides 7c and 9c of the trenches 7 and 9 are buried in the insulating film 21.

After the insulating film forming process is completed, the emitter region 17 and the collector region 19 are formed on the sides 7b and 9b of the trenches 7 and 9 exposed to the base region 11, respectively (region forming process).

Figure 3E:
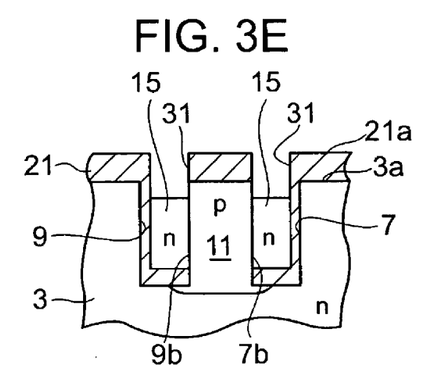

In this process, first, as illustrated in FIG. 3E, the polycrystalline silicon film 15 containing a large amount of an n-type impurity is formed in each of the trenches 31 for film formation. Then, after the polycrystalline silicon films 15 are formed, isotropic etching is conducted to remove unnecessary portions of the polycrystalline silicon films 15 such that upper surfaces of the polycrystalline silicon films 15 are below the surface 3a of the silicon substrate 3, that is, such that the polycrystalline silicon films 15 are formed only in the trenches 7 and 9.

Figure 3F:
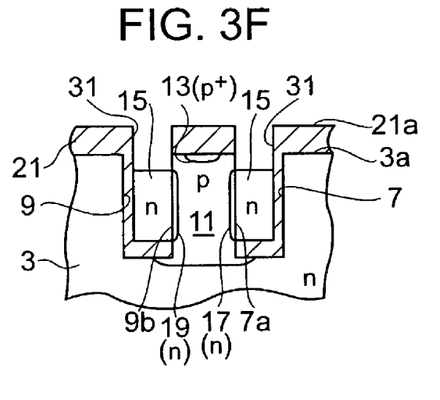

After the polycrystalline silicon films 15 are formed, as illustrated in FIG. 3F, a p-type region having an impurity concentration higher than that of the base region 11 (the base electrode outlet region 13) is formed by ion implantation on the side of the surface 3a of the silicon substrate 3. Then, annealing is conducted to activate the p-type region, and to diffuse the n-type impurities from the polycrystalline silicon films 15 into portions of the side surfaces of the base region 11, and to activate the emitter region 17 and the collector region 19 by capturing oxygen of a natural oxide film existing on the surface 3a of the silicon substrate 3 (not shown) into the polycrystalline silicon film 15, which ends the region forming process.

It should be noted that the emitter region 17 and the collector region 19 are formed below the region where the base electrode outlet region 13 is formed such that the base electrode outlet region 13 is not located between the emitter region 17 and the collector region 19.

Figure 3G:
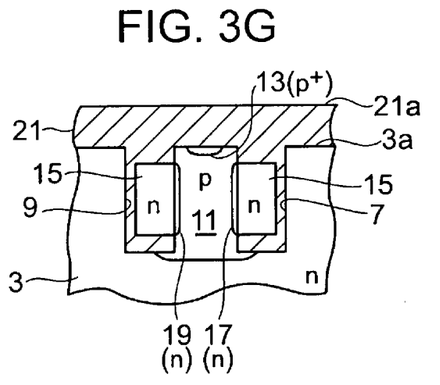

Then, as illustrated in FIG. 3G, the insulating film 21 is formed on the remaining portions of the trenches 31 for film formation to bury the polycrystalline silicon films 15 in the insulating film 21. After that, as illustrated in FIG. 2, contact holes are formed to pull out electrodes from the surface 21a of the insulating film 21 to the polycrystalline silicon films 15 or to the base electrode outlet region 13, and the contact holes are filled by conducting material to form the contacts 23.

Finally, the metal interconnects 25 for electric connection with the contacts 23 are formed on the surface 21a of the insulating film 21. Further, the protective film 27 for covering the surface 21a of the insulating film 21 and the metal interconnects 25 is formed. This completes the manufacture of the semiconductor device 1 having the longitudinal bipolar transistor 5.

As described above, according to the semiconductor device 1 and the method of manufacturing the same, in the trench forming process, extended formation of the trenches 7 and 9 to the depth direction from the surface 3a of the silicon substrate 3 can increase the area of the side surfaces 7b and 9b of the trenches 7 and 9, permitting easy increase in the effective junction areas of the emitter region 17 and the collector region 19 facing each other along the base region 11 therebetween, which can provide a semiconductor device 1 having a longitudinal bipolar transistor 5 with large current drivability.

Figure 4:
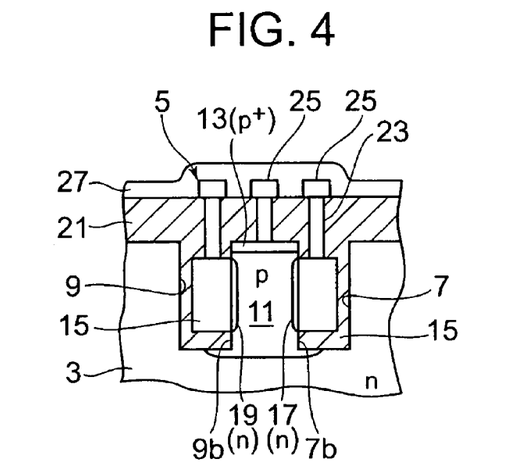
FIG. 4 is a schematic sectional view of a semiconductor device according to another embodiment of the present invention.

It should be noted that, in the above embodiment, although the base electrode outlet region 13 is formed so as not to be protruded to both the side surfaces 7b and 9b of the trenches 7 and 9, the present invention is not limited thereto. It is enough to form the base electrode outlet region 13 so as not be in contact with the emitter region 17 or the collector region 19 and so as not be located between the emitter region 17 and the collector region 19. For example, the base electrode outlet region 13 can be, as illustrated in FIG. 4, formed so as to be protruded to the one side surfaces 7b and 9b of the trenches 7 and 9 above the emitter region 17 and the collector region 19. In this structure, an optimum base width can be set independently from the position where the base electrode outlet region 13 is formed.

Figure 5A:
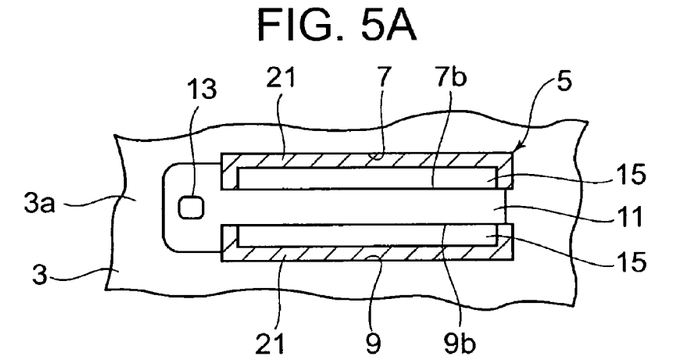
FIGS. 5A and 5B are schematic plan views of a semiconductor device according to still another embodiment of the present invention seen from a surface side of a silicon substrate.

Further, in the above embodiment, although the whole border between the base region 11 and the silicon substrate 3 seen from the side of the surface 3a of the silicon substrate 3 is removed by the two trenches 7 and 9 and the pair of connecting trenches 29, the present invention is not limited thereto. It is enough to form the two trenches 7 and 9 on the border portion between the base region 11 and the silicon substrate 3. For example, as illustrated in FIG. 5A, a part of the border portion between the base region 11 and the silicon substrate 3 seen from the side of the surface 3a of the silicon substrate 3 may remain. In this structure, filling the trenches 7 and 9 with the insulating film 21 is necessary in order that the polycrystalline silicon films 15 are not in contact with the silicon substrate 3.

Figure 5B:
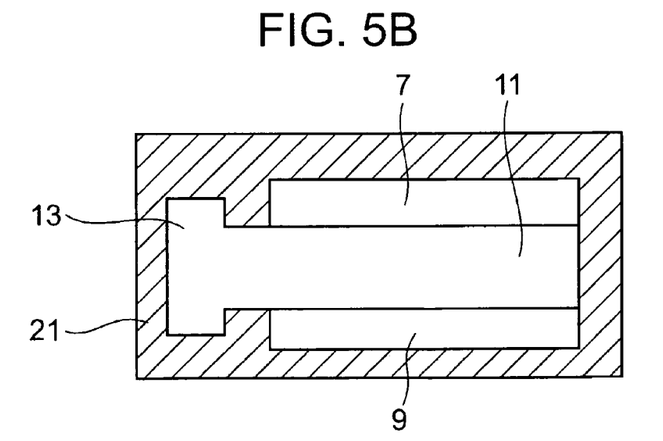

In this structure, also, in the insulating film forming process, filling the trenches 7 and 9 with the insulating film 21 except for formation regions for the emitter region 17 and the collector region 19 enables the emitter region 17, the base region 11, and the collector region 19, in this order, to be sandwiched by the insulating film 21 from the both ends, permitting elimination of unnecessary junction areas between the silicon substrate 3 and the emitter region 17 or the collector region 19, which can provide a longitudinal bipolar transistor 5 having both high speed operation capability and high transfer efficiency. Further, in this structure, possible formation of the base electrode outlet region 13 away from positions between the two trenches 7 and 9 permits an optimum base width setting independent from the position where the base electrode outlet region 13 is formed. Further, as illustrated in FIG. 5B, the base electrode outlet region 13 may be formed away from positions between the two trenches 7 and 9 and the whole periphery thereof may be surrounded by the insulating film 21. In this case, absence of unnecessary pn junctions contributes to make the transistor suitable for high speed operation.

Further, in the above-mentioned first embodiment, although one emitter region 17, one base region, and one collector region 19 are arranged in the direction of the arrangement, the present invention is not limited thereto, and a plurality of them may be arranged. In this structure, similarly to the case of the above-mentioned embodiment, three or more trenches are formed with a base region therebetween, and the trenches are filled with the polycrystalline silicon films 15 to be the emitter regions 17 or the collector regions 19. It should be noted that, in this structure, the emitter regions 17 and the collector regions 19 are alternately formed with a base region 11 therebetween, and only the other sides of the trenches at both ends in the direction of arrangement of the plurality of trenches are buried in the insulating film 21.

In the longitudinal bipolar transistor structured as described above, more increase in the effective junction areas of the emitter regions 17 and the collector regions 19 facing each other along the base regions 11 therebetween compared the afore-mentioned embodiment allows a large current to flow.

Further, in the above embodiment, although the base region 11 is formed to a deeper position than the bottom surfaces 7a and 9a of the trenches 7 and 9, the present invention is not limited thereto, and the base region 11 may be formed to a shallower position than the bottom surfaces 7a and 9a of the trenches 7 and 9. However, in this structure, it is necessary to bury in the insulating film 21 the one sides 7b and 9b of the trenches 7 and 9 made of the n-type impurity of the silicon substrate 3 in order for the emitter region 17 and the collector region 19 formed on the one sides 7b and 9b not to be in contact with the silicon substrate 3.

Next, a second embodiment according to the present invention is described with reference to FIGS. 6 and 7. It should be noted that identical numerals are used to designate identical elements in the semiconductor device 1 of the first embodiment, and description thereof is omitted.

Figure 6:
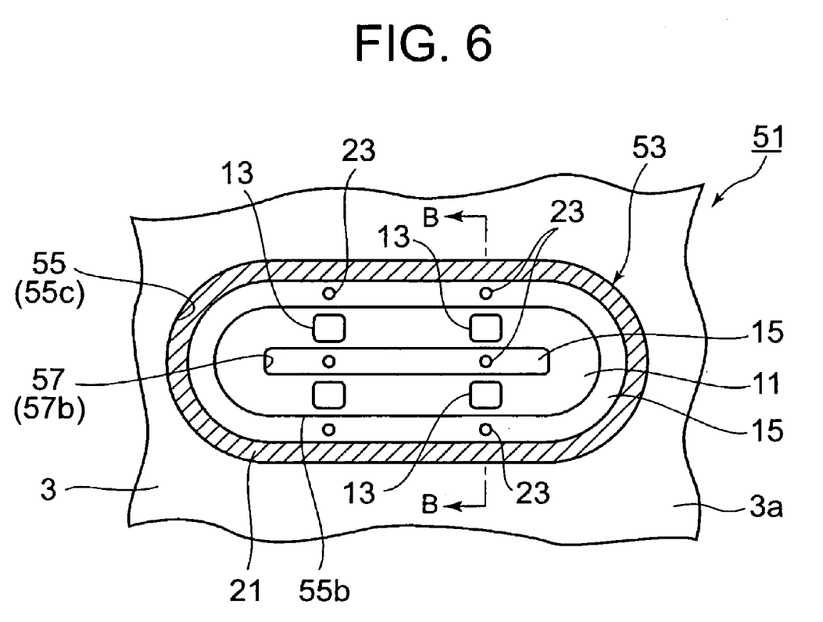
FIG. 6 is a schematic plan view of a semiconductor device according to a second embodiment of the present invention seen from a surface side of a silicon substrate.
Figure 7:
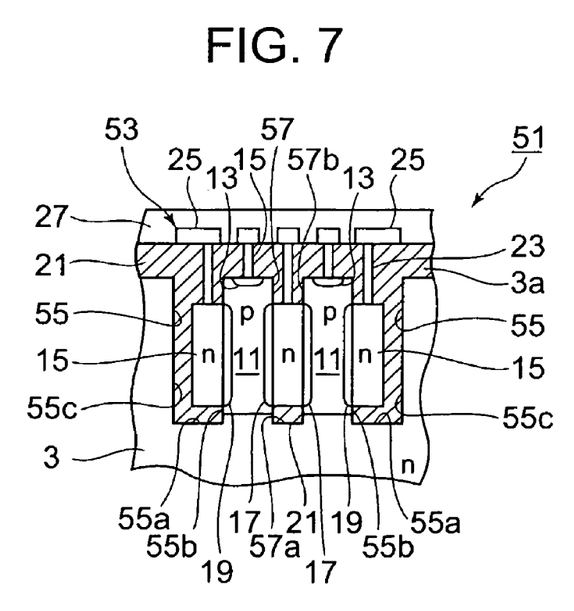
FIG. 7 is a sectional view taken along the arrows B-B of FIG. 6.

As illustrated in FIGS. 6 and 7, in a longitudinal bipolar transistor 53 of a semiconductor device 51, a first trench (one trench) 55 which surrounds a base region 11 and which is substantially ring-shaped in a plan view and a second trench (the other trench) 57 formed inside the first trench 55 with the base region 11 therebetween are formed in a silicon substrate 3. In other words, the base region 11 in the present embodiment is sandwiched between the first trench 55 and the second trench 57 and is formed so as to be ring-shaped in a plan view.

The first trench 55 and the second trench 57 are formed by vertically etching the silicon substrate 3 from a surface 3a thereof, and their bottom surfaces 55a and 57a are formed to a deeper position than a bottom surface of the base region 11.

The second trench 57 is formed in the shape of a narrow groove at a width of about 1 μm. The first trench 55 is formed so as to surround the substantially linearly formed second trench 57, and is formed of a pair of linear portions which extend in a longitudinal direction of the second trench 57 and sandwich the second trench 57 in its width direction, and arc portions which are semicircular so as to surround both ends of the second trench 57. Such a structure can make the distance uniform from a side 55b of the first trench 55 located on the side of an inner periphery (hereinafter referred to as inner peripheral side 55b) to a side 57b of the second trench 57.

The bottom surfaces 55a and 57a of the first trench 55 and the second trench 57 and a side 55c of the first trench 55 located on the side of an outer periphery (hereinafter referred to as outer peripheral side 55c) are buried in the insulating film 21. Polycrystalline silicon films 15 are formed on the inner peripheral side 55b of the first trench 55 and on the side 57b of the second trench 57 formed in the base region 11. In other words, the polycrystalline silicon film 15 fills the second trench 57 so as to be on an upper surface of the insulating film 21 which buries the bottom surface 57a of the second trench 57. It should be noted that upper surfaces of the polycrystalline silicon films 15 disposed in the trenches 55 and 57 are below the surface 3a of the silicon substrate 3.

An impurity diffusion region as a collector region 19 is formed on the inner peripheral side 55b of the first trench 55.

The impurity diffusion region is formed by diffusing an n-type impurity from the polycrystalline silicon film 15 into portions of side surfaces of the base region 11 that face the first trench 55. Another impurity diffusion region as an emitter region 17 is formed on the side 57b of the second trench 57. The impurity diffusion region is formed by diffusing an n-type impurity from the polycrystalline silicon film 15 into portions of side surfaces of the base region 11 that face the second trench 57.

Manufactured the semiconductor device 51 structured as described above, after conducting a base region forming process similar to that of the first embodiment, the first trench 55 and the second trench 57 are formed by vertically etching the silicon substrate 3 from the surface 3a thereof by means of anisotropic dry etching (trench forming process). In this process, the ring-shaped first trench is formed on the whole border between the base region 11 and the silicon substrate 3 seen from the side of the surface 3a of the silicon substrate 3. Further, the second trench 57 is formed inside the first trench 55.

Then, similarly to the case of the first embodiment, a insulating film forming process and a region forming process are conducted. When these processes are completed, the insulating film 21 is formed on the remaining portions of trenches 31 for film formation to bury in the insulating film 21 the polycrystalline silicon films 15 disposed in the first trench 55 and the second trench 57. Finally, a protective film 27 is formed to cover contacts 23 and metal interconnects 25 to complete the manufacture of the semiconductor device 51 having the longitudinal bipolar transistor 53.

The semiconductor device 51 and the method of manufacturing the same have effects similar to those of the first embodiment.

Further, the formation of the collector region 19 on the whole inner peripheral side 55b of the first trench 55 and the formation of the emitter region 17 on the whole side of the second trench 57 enables further increase in the effective junction areas of the emitter region 17 and the collector region 19 facing each other along the base region 11.

In addition, by forming one of the trenches which is ring-shaped and burying the outer peripheral side 55c of the first trench 55 in the insulating film 21, the emitter region 17, the base region 11, and the collector region 19 are surrounded by the insulating film 21, and thus, an unnecessary junction area between the base region 11 and the silicon substrate 3 can be reduced. The characteristics of the longitudinal bipolar transistor 53 can thus be further improved.

Figure 8:
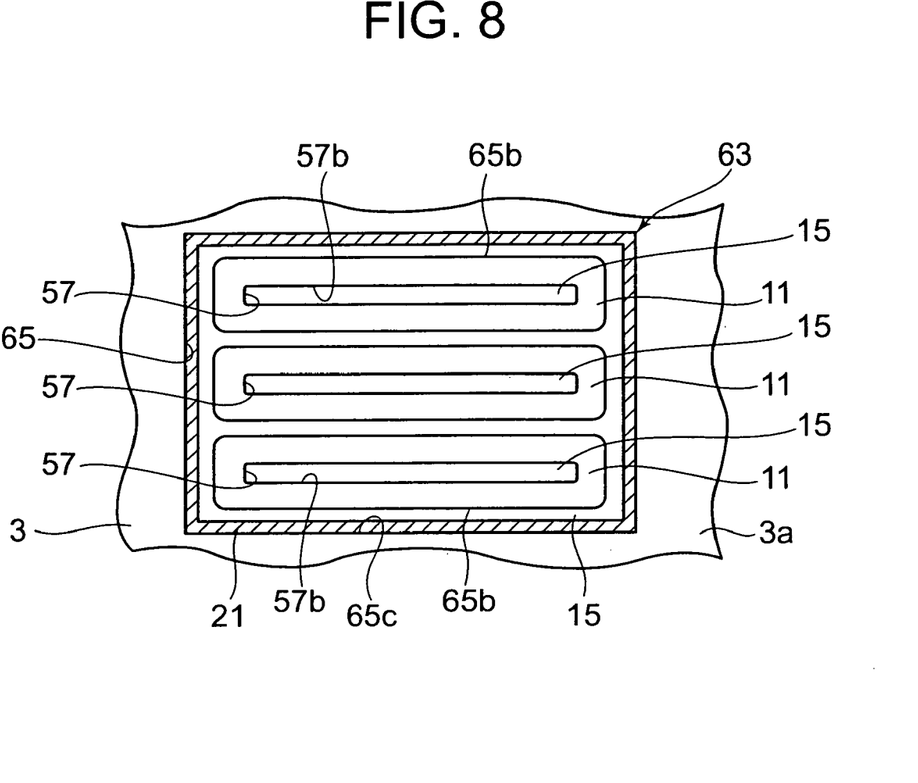
FIG. 8 is a schematic plan view of a semiconductor device according to another embodiment of the present invention seen from a surface side of a silicon substrate.

As in the above-mentioned second embodiment, when the ring-shaped base region 11 is provided around the second trench 57, for example, as illustrated in FIG. 8, a plurality of (three, in the illustrated example) units each formed of the second trench 57 and the ring-shaped base region 11 may be arranged in a width direction of the second trench 57. In this structure, a first trench (one trench) 65 is formed at positions surrounding the units formed of the plurality of second trenches 57 and the ring-shaped base regions 11 around the second trenches 57, and between the second trenches 57 adjacent to one another.

In the structure, it is enough if only an outer peripheral side 65c of the first trench 65 is buried in the insulating film 21. In other words, only the polycrystalline silicon film 15 fills the first trench 65 positioned between the ring-shaped base regions 11 adjacent to one another. It should be noted that, application of the same potential as that of the surrounding n-type substrate to the collector can eliminate the insulating film 21 on the outer peripheral side since isolation is not needed.

In a longitudinal bipolar transistor 63 structured as in the above, the effective junction areas of the emitter region 17 and the collector region 19 facing each other with the base region 11 therebetween can be further enlarged and a large current can pass therethrough.

Further, in the embodiment, although the emitter region 17 is formed on the side 57b of the second trench 57 while the collector region 19 is formed on the inner peripheral sides 55b and 65b of the first trenches 55 and 65, the present invention is not limited thereto. For example, the collector region 19 may be formed on the side 57b of the second trench 57 and the emitter region 17 may be formed on the inner peripheral sides 55b and 65b of the first trenches 55 and 65.

Figure 9:
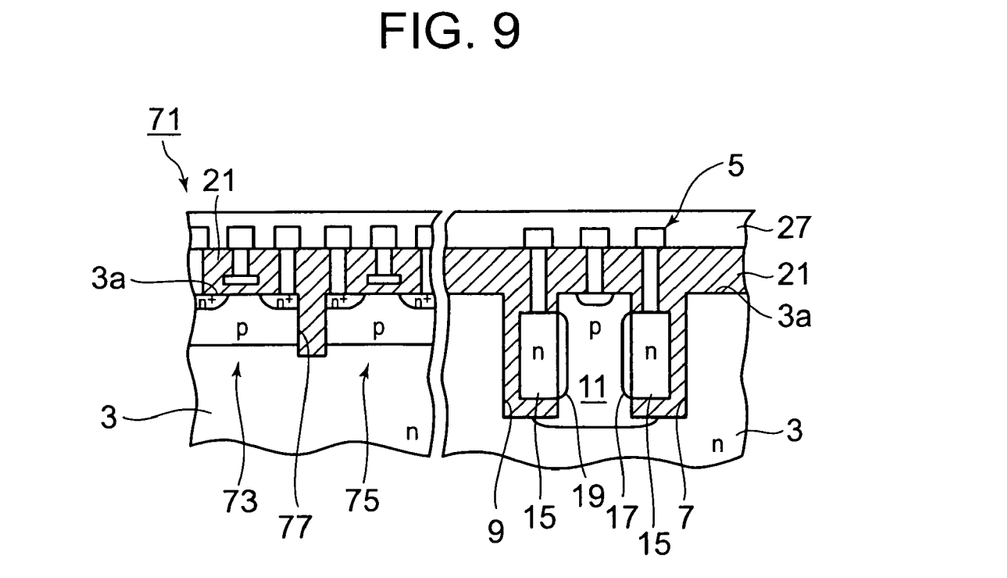
FIG. 9 is a schematic sectional view of a semiconductor device according to yet another embodiment of the present invention.

In the above-mentioned embodiments, although the semiconductor devices 1 and 51 having the longitudinal bipolar transistors 5, 53, and 63 are described, but the present invention is not limited thereto. For example, as illustrated in FIG. 9, the present invention may be applied to a semiconductor device 71 having the longitudinal bipolar transistor 5 and a plurality of MOS transistors 73 and 75 mounted thereon.

In particular, when a separating trench 77 for separating elements is formed between the MOS transistors 73 and 75 formed adjacent to each other, similarly to the trench forming process of the above-mentioned embodiments, the separating trench 77 may be formed by etching the silicon substrate 3 from the surface 3a thereof. In this case, the manufacturing efficiency of the semiconductor device 71 can be improved.

Further, in the above-mentioned embodiments, although the polycrystalline silicon films 15 are provided on the side surfaces 7b and 9b of the trenches 7 and 9, on the inner peripheral sides 55b and 65b of the first trenches 55 and 65, and on the side 57b of the second trench 57 all formed in the base region 11, the present invention is not limited thereto. It is enough if a material containing a large amount of impurity which can form impurity diffusion regions acting as the emitter region 17 and the collector region 19 is provided. Further, the material such as the polycrystalline silicon films 15 may be removed after the impurity diffusion regions are formed.

Further, in the above embodiments, although the material such as the polycrystalline silicon films 15 is provided along the side surfaces 7b and 9b of the trenches 7 and 9, on the inner peripheral sides 55b and 65b of the first trenches 55 and 65, and on the side 57b of the second trench 57 all formed in the base region 11 to form the impurity diffusion regions acting as the emitter region 17 and the collector region 19, the present invention is not limited thereto. The emitter region 17 and the collector region 19 may be formed by conducting ion implantation in a slanting direction from an opening side of the trenches 7 and 9, the first trenches 55 and 65, and the second trench 57 toward the side surfaces 7b and 9b, the inner peripheral sides 55b and 65b, and the side 57b, respectively.

As described above, when the material such as the polycrystalline silicon film 15 is removed after the emitter region 17 and the collector region 19 are formed, or the emitter region 17 and the collector region 19 are formed by ion implantation, the contacts 23 for pulling out the electrodes are in direct contact with the side surfaces 7b and 9b of the trenches 7 and 9, the inner peripheral sides 55b and 65b of the first trenches 55 and 65, and the side 57b of the second trench 57.

Further, the conductivity types of the respective layers in the above-mentioned embodiments may be reversed. More specifically, for example, the n-type silicon substrate 3, the p-type base region 11, and the n-type emitter region 17 and collector region 19 may be replaced by a p-type silicon substrate, an n-type base region 11, and p-type emitter region 17 and collector region 19, respectively.

Although embodiments of the present invention are described in detail with reference to the drawings, the specific structure is not limited thereto, and design changes and the like may be made which fall within the scope of the present invention.

What is claimed is:

1. A method of manufacturing a semiconductor device, comprising:
    forming a base region on a side of a surface of a silicon substrate;
    forming at least two trenches below the surface of the silicon substrate on portions of a border between the base region and the silicon substrate seen from the side of the surface by vertically etching the silicon substrate from the surface thereof so that the trenches face each other with the base region interposed therebetween;
    forming an electrically insulating film on at least bottom surfaces of the trenches; and
    forming an emitter region and a collector region in the trenches along portions of side surfaces of the base region.

2. A method of manufacturing a semiconductor device having a longitudinal bipolar transistor and a plurality of MOS transistors mounted thereon comprising:
    forming a separating trench for separating elements of the plurality of MOS transistors, simultaneously with the trench forming step of claim 1.

3. A method of manufacturing a semiconductor device, comprising:
    forming a base region on a side of a surface of a silicon substrate;
    forming a substantially ring-shaped first trench in a plan view below the surface of the silicon substrate and on an entire border between the base region and the silicon substrate seen from the side of the surface by vertically etching the silicon substrate from the surface thereof, and forming a second trench below the surface of the silicon substrate and inside the first trench with the base region interposed between the first trench and the second trench by vertically etching the silicon substrate from the surface thereof;
    forming an electrically insulating film on at least bottom surfaces of the first trench and the second trench; and
    forming one of an emitter region and a collector region in the first trench on portions of side surfaces of the base region, and forming the other of the emitter region and the collector region in the second trench on portions of side surfaces of the base region.

4. A method of manufacturing a semiconductor device having a longitudinal bipolar transistor and a plurality of MOS transistors mounted thereon comprising:
    forming a separating trench for separating elements of the plurality of MOS transistors, simultaneously with the trench forming step of claim 3.

* * * * *